United States Patent
Veit

(10) Patent No.: US 6,983,131 B2
(45) Date of Patent: Jan. 3, 2006

(54) CIRCUIT CONFIGURATION FOR DIRECT MODULATION

(75) Inventor: Werner Veit, Unterhaching (DE)

(73) Assignee: Infineon Technologies AG, Munich (DE)

(*) Notice: Subject to any disclaimer, the term of this patent is extended or adjusted under 35 U.S.C. 154(b) by 451 days.

(21) Appl. No.: 10/164,551

(22) Filed: Jun. 7, 2002

(65) Prior Publication Data

US 2002/0183018 A1 Dec. 5, 2002

Related U.S. Application Data

(63) Continuation of application No. PCT/DE00/04251, filed on Nov. 29, 2000.

(30) Foreign Application Priority Data

Dec. 7, 1999 (DE) .................... 199 58 908

(51) Int. Cl.
*H04B 1/04* (2006.01)

(52) U.S. Cl. .................... 455/102; 455/112; 455/113

(58) Field of Classification Search ............ 455/102, 455/260, 258, 110, 111, 112, 113, 119; 332/100, 332/101, 102; 375/302–308; 333/100; 327/247
See application file for complete search history.

(56) References Cited

U.S. PATENT DOCUMENTS 3,976,958 A * 8/1976 Seidel .................... 333/100
4,922,127 A * 5/1990 Denny .................... 327/247
5,179,359 A 1/1993 McLeod
5,861,781 A 1/1999 Ashby

FOREIGN PATENT DOCUMENTS

| DE | 38 26 882 A1 | 2/1990 |
|---|---|---|
| EP | 0 800 283 A2 | 10/1997 |
| EP | 0 893 887 A2 | 1/1999 |
| JP | 05-175749 | 7/1993 |
| JP | 07-177186 | 7/1995 |
| JP | 07-283842 | 10/1995 |
| WO | 94/14247 | 6/1994 |

* cited by examiner

*Primary Examiner*—Nick Corsaro
*Assistant Examiner*—Philip J. Sobutka
(74) *Attorney, Agent, or Firm*—Laurence A. Greenberg; Werner H. Stemer; Ralph E. Locher

(57) ABSTRACT

A circuit configuration for direction modulation contains an oscillator, whose output signal is split into quadrature components for modulation with a useful signal. A frequency shifting circuit has the effect that that the output frequency and the frequency of the oscillator are fractional rational multiples with respect to one another. The circuit contains a phase shifter for generating first further quadrature components and also a divider for generating second further quadrature components. The quadrature components are mixed with one another. As a result of the frequency offset, the oscillation frequency of the oscillator is shifted to outside the useful frequency band. Remodulation effects do not influence the adjacent channels. The circuit can be realized simply and cost-effectively and, in particular, requires only one oscillator.

13 Claims, 3 Drawing Sheets

CIRCUIT CONFIGURATION FOR DIRECT MODULATION

CROSS-REFERENCE TO RELATED APPLICATIONS

This application is a continuation of copending International Application No. PCT/DE00/04251, filed Nov. 29, 2000, which designated the United States and was not published in English.

BACKGROUND OF THE INVENTION

FIELD OF THE INVENTION

The invention relates to a circuit configuration for direct modulation. The circuit contains an oscillator having an output for a radio frequency signal, and a first phase shifting device having an input side coupled to an output of the oscillator and a respective output for mutually phase-shifted signals. The circuit has a first mixer and a second mixer each having an input side connected to a respective one of the outputs of the phase shifting device and also to terminals for mutually phase-shifted signal components of a useful signal and which each have an output for a modulated signal. A combination device is provided and has an input side connected to the outputs of the mixers and has an output for tapping off a radio frequency signal modulated with the useful signal.

In a mobile radio system, in a transmitter, the baseband signal containing the useful information is modulated onto a high-frequency carrier frequency in order, after suitable amplification, to be radiated via the antenna. A multiplicity of different modulators are known for the conversion of the useful signal to the carrier frequency.

In the case of direct modulation, the useful signal is provided in quadrature components and mixed with respective quadrature components of the carrier frequency. Summation of the modulated quadrature components yields the radio frequency signal that is to be radiated. The carrier frequency is supplied by an oscillator. The output signal thereof is split, by a phase shifter, into signal components that are phase-shifted by 90° with respect to one another. If appropriate, dividers are inserted into the signal path. Direct modulation is employed in particular in digital cellular mobile radio units. The use of only a single oscillator and thus the simple and cost-effective realization is advantageous. Noise and frequency components in the transmission signal that lie outside the allowed frequency band are suppressed by filters upstream of the antenna.

Apart from the useful signal modulation, the oscillator oscillates at the same frequency as the radiated signal or at an integer multiple thereof. What is problematic in this case is that the signal output by the modulator on the output side is fed back parasitically into the oscillator located on the input side. Various effects are involved here, which are effective to an increased extent in particular in the case of integration on a single semiconductor chip. It is customary for the oscillator to be realized as a resonant circuit with a bonding wire routed out from the chip. The bonding wire can, on the one hand, act as a receiving antenna for radio frequency signals radiated at another location, so that the output signal of the modulator is fed back into the circuit again. On the other hand, the bonding wire of the modulator can act as a transmitting antenna whose radiation is received by bonding wires that serve for feeding supply potentials, so that feedback into the modulator is thereby affected. Furthermore, resonant circuits with integrated, planar coils that act just the same as a transmitter or receiver are also customary. Moreover, the currents flowing in the substrate of the semiconductor chip containing the modulator bring about feedback of the output-side signal on the input-side oscillator. The oscillator is highly selective, so that it is extremely receptive to coupling-in in its tunable frequency range.

If the modulated output signal of the direct modulator is fed back to the input-side oscillator, the interference is in turn modulated; a so-called remodulation effect is thus produced.

The result of this is that the output-side spectrum is broadened. However, the permissible frequency band for the mobile radio systems is limited. Within the allowed frequency band, the respective transmitter is restricted to one or more transmission channels. The widening of the frequency spectrum on account of the remodulation effects gives rise to the risk that frequency components of the useful signal may lie outside the permissible transmission channel and specified spectral transmission masks are violated. Adjacent channels are thereby subject to interference. Remodulation effects must therefore be avoided.

SUMMARY OF THE INVENTION

It is accordingly an object of the invention to provide a circuit configuration for direct modulation that overcomes the above-mentioned disadvantages of the prior art devices of this general type, which can be realized in a simple manner but avoids remodulation effects sufficiently reliably.

With the foregoing and other objects in view there is provided, in accordance with the invention, a circuit configuration for direct modulation. The circuit configuration contains an oscillator having an output outputting a radio frequency signal, a first phase shifting device having an input and outputs for mutually phase-shifted signals, terminals for mutually phase-shifted signal components of a useful signal, and a first mixer. The first mixer has a first input connected to a first output of the outputs of the first phase shifting device, a second input connected to a first terminal of the terminals, and an output for a first modulated signal. A second mixer is provided and has a first input connected to a second output of the outputs of the first phase shifting device, a second input connected to a second terminal of the terminals, and an output for a second modulated signal. A first combination device has inputs connected to the output of the first mixer and to the output of the second mixer, and an output for tapping off a modulated radio frequency signal modulated with the useful signal. A second phase shifting device is provided and has outputs for first mutually phase-shifted signals and an input coupled to the output of the oscillator. A third phase shifting device has outputs for second mutually phase-shifted signals and an input connected to a first output of the outputs of the second phase shifting device. A third mixer is provided and has inputs connected to a second output of the outputs of the second phase shifting device and to a first output of the outputs of the third phase shifting device. The third mixer further has an output for third a modulated signal. A fourth mixer is provided and has inputs connected to the first output of the second phase shifting device and to a second output of the outputs of the third phase shifting device. The fourth mixer further has an output for a fourth modulated signal. A second combination device is provided and has inputs connected to the output of the third mixer and to the output of the fourth mixer. The second combination device further has an output connected to the input of the first phase shifting device.

In the case of the direct modulation configuration according to the invention, the oscillator does not actually oscillate at an integer multiple of the transmission frequency. Rather, the oscillation frequency of the oscillator is only a fractional rational multiple of the output-side carrier frequency, i.e. the frequency of the oscillator is shifted relative to the output frequency. The feedback is reduced since the carrier frequency lies outside the region of the highest sensitivity of the oscillator, namely the instantaneous resonant frequency thereof. With suitable dimensioning of the frequency offset, it can be ensured that mixing products or remodulation products that are nevertheless generated lie outside the adjacent transmission channels of the frequency band of the mobile radio system. Such remodulation products can be suppressed without difficulty by the correspondingly highly effective band limiting filters of the mobile radio unit, which are provided anyway and suppress frequency components outside the frequency band reserved for the mobile radio service. During production, the costs are significantly determined by the oscillator. Since, moreover, only a single oscillator is required in the case of the circuit according to the invention, the production of the direct modulation circuit remains cost-effective. After suitable amplification, the output signal of the direct modulator is coupled to an antenna and radiated.

The phase shifters can be embodied as all-pass networks that do not change the frequency of the processed signal. As an alternative, it is possible to use master slave (MS) flip-flops that divide the input signal by 2. A tap at the output of the slave of the MS flip-flops supplies one of the output signals of the phase shifter, for example, the output signal whose frequency is halved and which is in phase with respect to the input signal. The tap at the output of the master of the MS flip-flops supplies the output signal of the phase shifter that is phase-shifted with respect thereto. The output signals are quadrature components and are phase-shifted by 90° with respect to one another. Depending on the frequency relationship between the oscillator and the output carrier frequency, all the phase shifters can be embodied as dividers or as all-pass networks or as a combination of the two.

The combination of the second and third phase shifters with the second and third mixers and the further combination device shift the frequency of the oscillator with respect to the output-side carrier frequency in such a way that the frequencies lie in the ratio of a fractional rational multiple with respect to one another. An image frequency generated by the mixers themselves is suppressed again by the combination element. If quadrature components that are of the same type with regard to the phase angle relative to the outputs of the phase shifters are in each case fed to the mixers, the lower sideband is suppressed in the summing element and the upper sideband is transmitted. If quadrature components that are not of the same type with regard to the phase angle relative to the outputs of the phase shifters are in each case fed to the mixers, the upper sideband is suppressed and the lower sideband is transmitted. Therefore, the above-mentioned combination affects purely a shift in the spectrum fed to it on the input side. The quadrature components generated by the second and third phase shifters are phase-shifted by 90° with respect to one another. Depending on the connections of the outputs of the phase shifters at the mixers, one of the two sidebands is suppressed downstream of the summing point. If the connections of one of the outputs are interchanged between the mixers, then the other sideband is suppressed.

The components that are additionally required for the invention are conventional all-pass networks or master-slave flip-flops and mixers and also a summing element. Therefore, the additional circuitry outlay can be realized using standard components with a tenable outlay. The circuit is therefore appropriate in particular for use in a cellular digital mobile radio unit.

In accordance with an added feature of the invention, a divider is coupled between the output of the oscillator and the input of the first phase shifting device.

In accordance with an additional feature of the invention, the first, second and third phase shifting devices generate output signals that are phase-shifted by a phase of 90° with respect to one another. At least one of the first, second and third phase shifting devices contains a master-slave flip-flop with a master output and a slave output as the outputs. Alternatively, at least one of the first, second and third phase shifting devices is an all-pass network.

In accordance with a further feature of the invention, the third phase shifting device is a divider.

In accordance with another feature of the invention, the third and fourth mixers are in each case connected to one of the outputs of the second phase shifting device and to one of the outputs of the third phase shifting device.

In accordance with a further added feature of the invention, the outputs of the second phase shifting devices include an in-phase output outputting an output signal having a same phase angle as a respective input signal, and a phase-shifted output outputting an output signal having a phase angle shifted by 90° relative to a respective input signal. The outputs of the third phase shifting devices include an in-phase output outputting an output signal having a same phase angle as a respective input signal, and a phase-shifted output outputting an output signal having a phase angle shifted by 90° relative to a respective input signal. The inputs of the third mixer are connected to the in-phase output of the second and third phase shifting devices. The inputs of the fourth mixer are connected to the phase-shifted output of the second and third phase shifting devices.

In accordance with a concomitant feature of the invention, the outputs of the second phase shifting device include an in-phase output outputting an output signal having an equivalent phase angle as a respective input signal, and a phase-shifted output outputting an output signal having a phase angle shifted by 90° relative to a respective input signal. The outputs of the third phase shifting device include an in-phase output outputting an output signal having an equivalent phase angle as a respective input signal, and a phase-shifted output outputting an output signal having a phase angle shifted by 90° relative to a respective input signal. The inputs of the third and fourth mixers are connected to the in-phase output and the phase-shifted output of the second and third phase shifting devices.

Other features which are considered as characteristic for the invention are set forth in the appended claims.

Although the invention is illustrated and described herein as embodied in a circuit configuration for direct modulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advan-

DESCRIPTION OF THE PREFERRED EMBODIMENTS

Figure 3:
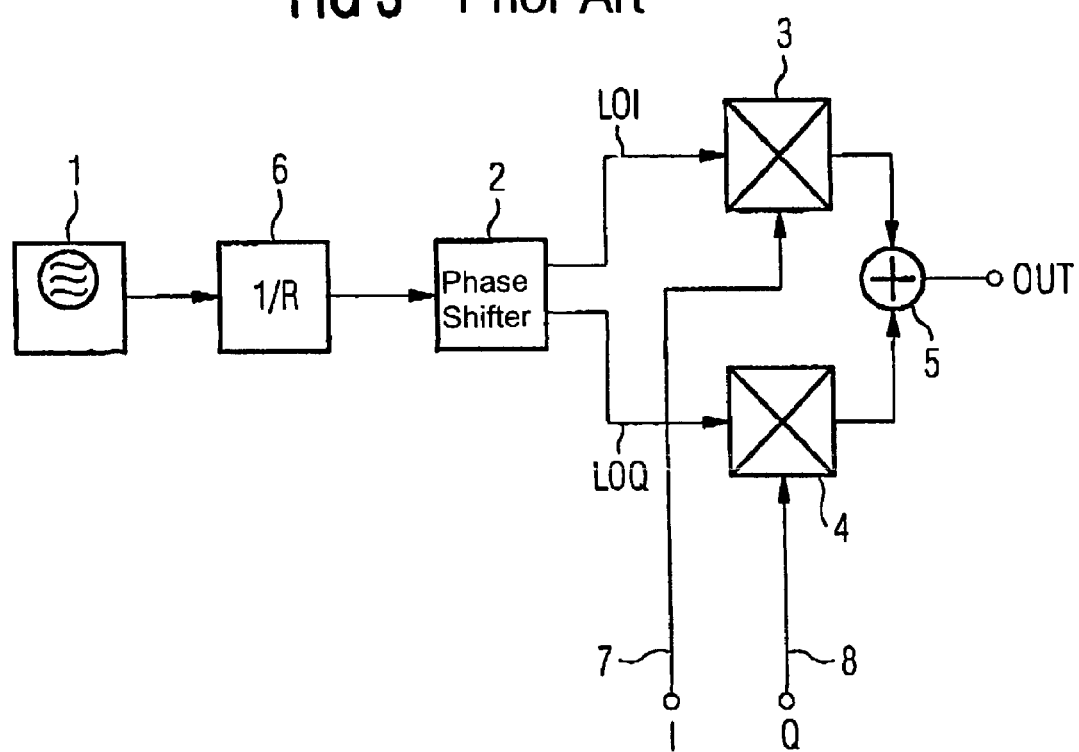
FIG. 3 is a block diagram of the direct modulator according to the prior art.

Referring now to the figures of the drawing in detail and first, particularly, to FIG. 3 thereof, there is shown a conventional direct modulator containing a radio frequency oscillator 1, which oscillates at a same carrier frequency as an output signal OUT of the direct modulator. The oscillator 1 is a voltage-controlled oscillator (VCO), which can be tuned in the permissible frequency band to one of the carrier frequencies of the available transmission channels. The oscillator 1 is integrated on a semiconductor chip, a bonding wire that is routed out at one pad of the integrated circuit and is led back again at another pad serves as a resonator. Furthermore, planar coils in the form of metal interconnects are conceivable as the resonators. A phase shifter 2 generates quadrature components LOI and LOQ from the output signal of the VCO 1. The quadrature components are signals that are phase-shifted by 90° with respect to one another and have a phase angle of 0° or 90° in comparison with the input-side phase. The phase shifter can be realized as an all-pass network, so that output and input frequencies of the phase shifter are identical. An alternative is a realization as a master-slave flip-flop, in which the output signal amounts to half the frequency of the input signal. If appropriate, dividers with an arbitrary integer divider ratio are possible. In these cases, the output frequency of the direct modulator and the oscillation frequency of the VCO differ from one another by an integer multiple. In a mixer 3, one quadrature component LOI of the carrier signal is mixed with one quadrature component I of the useful signal. In another mixer 4, the other quadrature component LOQ of the carrier signal is mixed with the other quadrature component Q of the useful signal. The signal components I, Q are provided at respective terminals 7, 8. The modulation products are added in a summer 5 and produce the modulated output signal OUT. If appropriate, a divider 6 having a divider factor 1/R, where R may assume the values 2, 4, etc., is connected between the VCO 1 and the phase shifter 2. In this case, the carrier frequency of the output signal OUT is a once again different multiple of the oscillation frequency of the VCO 1.

Figure 1:
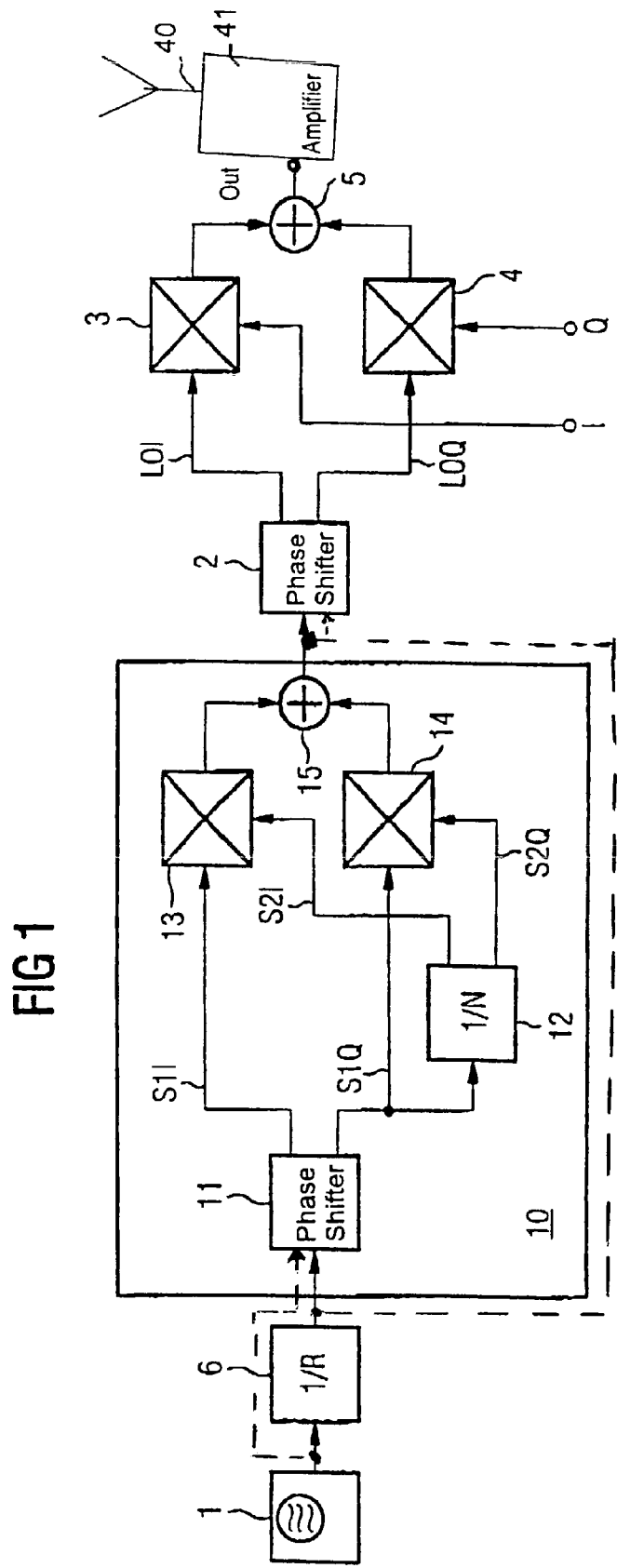
FIG. 1 is a block diagram of a direct modulator according to the invention.

In addition to the circuit shown in FIG. 3, the direct modulator according to FIG. 1 has a circuit block 10. On an input side, the circuit block 10 contains a second phase shifter 11, which is connected to the divider 6—or else can be connected directly to the VCO 1, as shown by the dashed line. Alternatively, the divider 6 can be connected directly to the first phase shifter 2, as shown by the dashed line, or to both the first and second phase shifter. The phase shifter 11 generates quadrature components S1I and S1Q. A third phase shifter 12 is fed by one of the output signals of the second phase shifter 11, by the signal S1Q in FIG. 1. The third phase shifter 12 in turn generates quadrature components S2I and S2Q. The phase shifter 12 is always a divider by N. It contains master-slave flip-flops. The zero-phase quadrature components S1I and S2I are fed to a third mixer 13. The output signals S1Q, S2Q which are phase-shifted by 90° with regard to the respective input signals of the phase shifters 11, 12 are fed to a fourth mixer 14. The mixing products present at the outputs of the mixers 13, 14 are added in a summer 15, whose output signal forms the input signal of the phase shifting element 2.

The mixing products of the mixers 13, 14 contain upper and lower sidebands, one of which is suppressed by the summation in the combination element 15. The circuit block 10 can therefore be regarded as a type of image rejection mixer, so-called IMR mixer. Since only one sideband is output by the circuit block 10, the carrier frequency of the output signal of the block 10 is shifted with regard to the carrier frequency of its input signal. The same then applies correspondingly to the frequency of the output signal OUT of the modulator relative to the frequency of the VCO 1. Depending on the connections of the lines for S1I, S1Q and S2I and S2Q at the mixers 13, 14, one of the sidebands is suppressed. If S1I is interchanged with S1Q or S2I is interchanged with S2Q, the other sideband is suppressed.

In the case of the configuration shown, the following formula results for the relationship between a frequency $f_{OUT}$ of the output signal OUT and a frequency $f_{VCO}$ of the oscillator VCO 1, if the phase shifter 2 is embodied as a pure phase shifter, for example as an all-pass network, and the phase shifter 11 is embodied as a divider by 2:

$$f_{VCO} = \frac{2 \times R \times N}{N+1} f_{OUT}$$

If both the I and Q signal components are fed to the mixers 13, 14, the lower sideband is generated at the output of the circuit block 10. By way of example, the signals S1I and S2Q are fed to the mixer 13, and the signals S1Q and S2I are fed to the mixer 14. If the phase shifter 2 is a phase shifter realized as an all-pass network, the following formula results for the relationship between the output frequency $f_{OUT}$ and the frequency $f_{VCO}$ of the VCO 1:

$$f_{VCO} = \frac{2 \times R \times N}{N-1} f_{OUT}$$

If the phase shifter 2 is not an all-pass network but rather a divider by 2, the frequency of the VCO 1 is again increased by the factor 2 relative to the frequency $f_{OUT}$ of the output signal. It is noticeable that the output frequency is a fractional rational multiple, namely proportional to N/(N+1) or proportional to N/(N−1), with regard to the oscillation frequency of the oscillator.

In a refinement of the invention, the phase shifters 2 and 11 can be realized differently. Either an all-pass network or a divider by 2 in the form of a master-slave flip-flop is possible. The phase shifter 12 is always a divider in the form of a master-slave flip-flop having the division factor 1/N, where N can assume the values 2, 4, 8, etc. The divider 6 is optional depending on the desired frequency ratio. Through different combinations of all-pass networks or master-slave flip-flops for the phase shifters 2, 11 and divider factors of the dividers 12, 6, it is possible to generate a multiplicity of fractional rational frequency relationships between the carrier frequencies of the output signal OUT and the oscillation frequency of the oscillator 1. The combination is to be chosen such that the signal components fed back to the VCO from the output signal OUT, during the remodulation by the mixers 3, 4 do not again lie in a useful channel of the frequency band that is permissible for the mobile radio service. Remodulation products outside the frequency band are suppressed by filters with sufficient attenuation that are provided for this purpose anyway.

FIG. 1 further shows an antenna 40 having an amplifier device 41. The antenna is coupled to the output of the summer 5.

Figure 2:
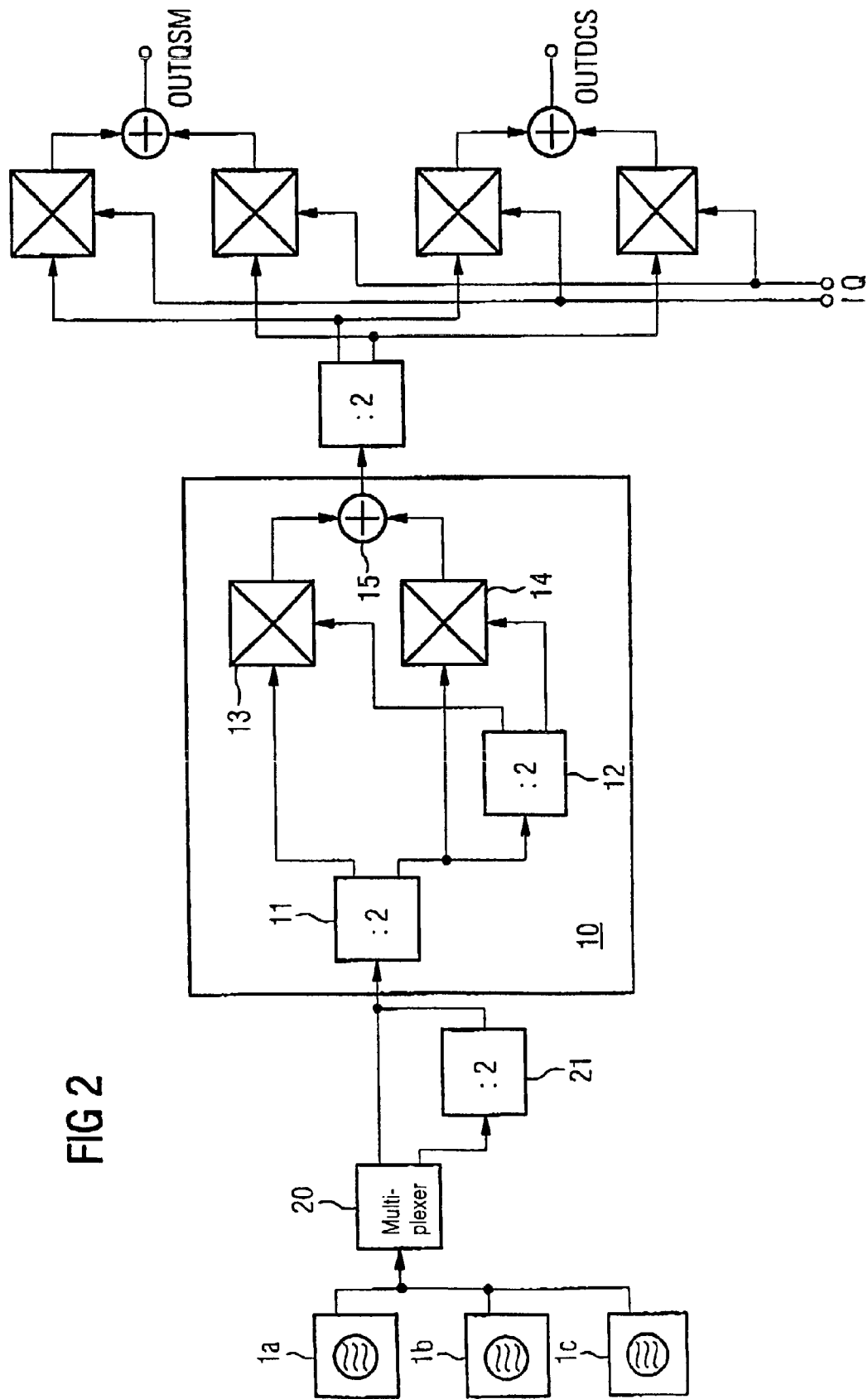
FIG. 2 is a block diagram of an exemplary embodiment of a direct modulator in a triple-band transmitter or a cellular mobile radio unit.

An exemplary embodiment of a triple-band transmitter, suitable for the transmission frequencies of the mobile radio standard GSM900, DCS1800 and DCS1900, is illustrated in FIG. 2. On the output side, provision is made of a pair of I, Q modulators for GSM900, and also owing to the frequency bands that lie close together, a single pair of I, Q modulators for DCS1800 and DCS1900. The circuit block 10 has two master-slave flip-flops 11, 12. I and Q signal components are respectively mixed in each case in the mixers 13, 14. On the input side, VCOs 1a, 1b and 1c are provided for each frequency band. In the case of GSM900, a divider by 2, designated by 21, is connected into the signal path via a multiplexer 20; the divider is circumvented in the case of DCS1800/DCS1900. Depending on the desired frequency band, the respectively assigned radio frequency oscillator 1a, 1b or 1c and the assigned I, Q modulators are activated. The fractional rational frequency relationship between the carrier frequency of the respective output signal $f_{OUTGSM}$ or $f_{OUTDCS}$ and the respectively assigned oscillation frequency of the input-side VCO is $f_{VCO}=2\times2\times4/3\times f_{OUTGSM}$ for GSM900 and $f_{VCO}=2\times4/3\times f_{OUTDCS}$ for DCS1800/DCS1900. All relevant remodulation products resulting from the feedback of the output signals OUTGSM and OUTDCS to the respectively assigned VCOs 1a, 1b and 1c lie outside the frequency bands that are permissible for the mobile radio standards. For GSM900, for example, the transmission frequency band lies between 880 . . . 915 MHz, that is to say has a bandwidth of 35 MHz. The channels are disposed with the separation of 200 kHz. The VCO 1a can be tuned in the range of 4693.3 . . . 4880.0 MHz. Resulting remodulation products and also mixing products that are not suppressed by the IMR circuit 10 do not come within the transmission band and lie outside the 35 MHz-wide transmission bandwidth. The VCOs are expediently integrated as voltage-controlled RF oscillators with the rest of the circuit components of the direct modulator on a single semiconductor chip. The inductive resonators are realized as bonding wires or planar coils, e.g. as wide aluminum or copper tracks. In order to keep the tuning range and thus the noise of each VCO minimal, a separate oscillator was chosen for each band; an individual oscillator with an appropriately large tuning range would also be conceivable.

I claim:

1. A circuit configuration for direct modulation, comprising:
   an oscillator having an output outputting a radio frequency signal;
   a first phase shifting device having an input and outputs for mutually phase-shifted signals;
   terminals for mutually phase-shifted signal components of a useful signal;
   a first mixer having a first input connected to a first output of said outputs of said first phase shifting device, a second input connected to a first terminal of said terminals, and an output for a first modulated signal;
   a second mixer having a first input connected to a second output of said outputs of said first phase shifting device, a second input connected to a second terminal of said terminals, and an output for a second modulated signal;
   a first combination device having inputs connected to said output of said first mixer and to said output of said second mixer, and an output for tapping off a modulated radio frequency signal modulated with the useful signal;
   a second phase shifting device having outputs for first mutually phase-shifted signals and an input coupled to said output of said oscillator;
   a third phase shifting device having outputs for second mutually phase-shifted signals and an input connected to a first output of said outputs of said second phase shifting device;
   a third mixer having inputs connected to a second output of said outputs of said second phase shifting device and to a first output of said outputs of said third phase shifting device, said third mixer further having an output for third a modulated signal;
   a fourth mixer having inputs connected to said first output of said second phase shifting device and to a second output of said outputs of said third phase shifting device, said fourth mixer further having an output for a fourth modulated signal; and
   a second combination device having inputs connected to said output of said third mixer and to said output of said fourth mixer, said second combination device further having an output connected to said input of said first phase shifting device.

2. The circuit configuration for direct modulation according to claim 1, further comprising a divider coupled between said output of said oscillator and said input of said first phase shifting device.

3. The circuit configuration for direct modulation according to claim 1, wherein said third phase shifting device is a divider.

4. The circuit configuration for direct modulation according to claim 1, further comprising a divider connected between said output of said oscillator and said input of said second phase shifting device.

5. The circuit configuration for direct modulation according to claim 1, wherein said second phase-shifting device generates the first mutually phase-shifted signals as quadrature components at an angle of 0° and 90°, respectively, derived from an input signal provided to said second phase-shifting device.

6. The circuit configuration for direct modulation according to claim 1, wherein the second mutually phase-shifted signals are quadrature components at an angle of 0° and 90°, respectively, derived from an input signal provided to said third second phase-shifting device.

7. The circuit configuration for direct modulation according to claim 1, wherein said first, second and third phase shifting devices generate output signals which are phase-shifted by a phase of 90° with respect to one another.

8. The circuit configuration for direct modulation according to claim 7, wherein at least one of said first, second and third phase shifting devices contains a master-slave flip-flop with a master output and a slave output as said outputs.

9. The circuit configuration for direct modulation according to claim 7, wherein at least one of said first, second and third phase shifting devices is an all-pass network.

10. The circuit configuration for direct modulation according to claim 1, wherein said third and fourth mixers are in each case connected to one of said outputs of said second phase shifting device and to one of said outputs of said third phase shifting device.

11. The circuit configuration for direct modulation according to claim 10, wherein:
- said outputs of said second phase shifting devices include an in-phase output outputting an output signal having a same phase angle as a respective input signal, and a phase-shifted output outputting an output signal having a phase angle shifted by 90° relative to a respective input signal;
- said outputs of said third phase shifting devices include an in-phase output outputting an output signal having a same phase angle as a respective input signal, and a phase-shifted output outputting an output signal having a phase angle shifted by 90° relative to a respective input signal;
- said inputs of said third mixer connected to said in-phase output of said second and third phase shifting devices; and
- said inputs of said fourth mixer connected to said phase-shifted output of said second and third phase shifting devices.

12. The circuit configuration for direct modulation according to claim 10, wherein:
- said outputs of said second phase shifting device include an in-phase output outputting an output signal having an equivalent phase angle as a respective input signal, and a phase-shifted output outputting an output signal having a phase angle shifted by 90° relative to a respective input signal;
- said outputs of said third phase shifting device include an in-phase output outputting an output signal having an equivalent phase angle as a respective input signal, and a phase-shifted output outputting an output signal having a phase angle shifted by 90° relative to a respective input signal; and
- said inputs of said third and fourth mixers connected to said in-phase output and said phase-shifted output of said second and third phase shifting devices.

13. A cellular digital mobile radio unit, comprising:
- a circuit configuration for direct modulation, including:
  - an oscillator having an output outputting a radio frequency signal;
  - a first phase shifting device having an input and outputs for mutually phase-shifted signals;
  - terminals for mutually phase-shifted signal components of a useful signal;
  - a first mixer having a first input connected to a first output of said outputs of said first phase shifting device, a second input connected to a first terminal of said terminals, and an output for a first modulated signal;
  - a second mixer having a first input connected to a second output of said outputs of said first phase shifting device, a second input connected to a second terminal of said terminals, and an output for a second modulated signal;
  - a first combination device having inputs connected to said output of said first mixer and to said output of said second mixer, and an output for tapping off a modulated radio frequency signal modulated with the useful signal;
  - a second phase shifting device having outputs for first mutually phase-shifted signals and an input coupled to said output of said oscillator;
  - a third phase shifting device having outputs for second mutually phase-shifted signals and an input connected to a first output of said outputs of said second phase shifting device;
  - a third mixer having inputs connected to a second output of said outputs of said second phase shifting device and to a first output of said outputs of said third phase shifting device, said third mixer further having an output for third a modulated signal;
  - a fourth mixer having inputs connected to said first output of said second phase shifting device and to a second output of said outputs of said third phase shifting device, said fourth mixer further having an output for a fourth modulated signal; and
  - a second combination device having inputs connected to said output of said third mixer and to said output of said fourth mixer, said second combination device further having an output connected to said input of said first phase shifting device; and
- an antenna having an amplifier device, said antenna coupled to said output of said first combination device.

* * * * *